United States Patent
Varillon et al.

(12) 
(10) Patent No.: US 12,218,612 B2
(45) Date of Patent: Feb. 4, 2025

(54) INVERTER UNIT

(71) Applicant: Valeo Japan Co., Ltd, Saitama (JP)

(72) Inventors: Mathieu Varillon, Prague (CZ); Herve Ribot, Le Mesnil Saint Denis (FR); Augustin Bellet, Le Mesnil Saint Denis (FR); Praveen Mathesan, Chennai (IN); Baskaran Raja, Chennai (IN); Prakash Ganesan, Chennai (IN)

(73) Assignee: Valeo Japan Co., Ltd, Saitama (JP)

( * ) Notice: Subject to any disclaimer, the term of this patent is extended or adjusted under 35 U.S.C. 154(b) by 144 days.

(21) Appl. No.: 18/059,072

(22) Filed: Nov. 28, 2022

(65) Prior Publication Data
US 2023/0170833 A1 Jun. 1, 2023

(30) Foreign Application Priority Data

Nov. 27, 2021 (IN) .............................. 202141054911

(51) Int. Cl.
*H02P 27/06* (2006.01)
*F25B 49/02* (2006.01)
*H02K 11/33* (2016.01)

(52) U.S. Cl.
CPC ............ *H02P 27/06* (2013.01); *F25B 49/025* (2013.01); *H02K 11/33* (2016.01); *F25B 2600/021* (2013.01); *H02K 2211/03* (2013.01)

(58) Field of Classification Search
CPC ....... H02P 27/06; H02K 11/33; F25B 49/025; H05K 7/14322
See application file for complete search history.

(56) References Cited

U.S. PATENT DOCUMENTS

| | | | |
|---|---|---|---|
| 8,519,561 B2 * | 8/2013 | Azuma | B60L 50/11 307/112 |
| 10,850,623 B2 * | 12/2020 | Chung | H05K 7/20509 |
| 11,936,251 B2 * | 3/2024 | Kobayashi | H03H 1/0007 |
| 2010/0327654 A1 * | 12/2010 | Azuma | H05K 7/1432 307/9.1 |
| 2020/0362843 A1 * | 11/2020 | Yim | H02M 7/48 |
| 2020/0381981 A1 * | 12/2020 | Kobayashi | H05K 1/18 |

FOREIGN PATENT DOCUMENTS

| | | |
|---|---|---|
| CN | 111 771 055 B | 4/2022 |
| KR | 2020 0132543 A | 11/2020 |

OTHER PUBLICATIONS

Extended European Search Report Issued in Corresponding EP Application No. 22 208 367.7, dated Mar. 21, 2023. (7 Pages).

\* cited by examiner

*Primary Examiner* — Thai T Dinh
(74) *Attorney, Agent, or Firm* — Osha Bergman Watanabe & Burton LLP

(57) ABSTRACT

An inverter unit (100) includes an inverter (110), an inverter housing (120) and an insulating member (130). The inverter (110) drives an electric motor (200) and includes at least one power module (112) for converting a High Voltage (HV) Direct Current (DC) to a three-phase Alternating Current (AC) that drives the electric motor (200). The inverter housing (120) receives the inverter (110). The power module (112) is mounted on an end wall (120a) of the inverter housing (120) by means of bolts (114). The insulating member (130) corresponding to each bolt (114) is disposed between a head portion (114a) of the corresponding bolt (114) and the power module (112).

14 Claims, 13 Drawing Sheets

INVERTER UNIT

TECHNICAL FIELD

The present invention relates to an inverter unit, more specifically, the present invention relates to an inverter unit for a compressor of a vehicle air-conditioning unit.

BACKGROUND

Generally, a motor-driven compressor for an air-conditioning system of a vehicle includes a compression unit for compressing refrigerant, an electric motor to drive the compression unit and an inverter unit. The motor driven compressor further includes a main housing also referred to as compressor housing to accommodate the compression unit and the electric motor and a separate inverter housing to accommodate the inverter unit. The compressor housing is made of metal such as aluminium and is generally grounded.

The inverter housing is also made of metal such as aluminium, and includes an end wall, a peripheral wall extending from the periphery of the end wall to define a Printed Circuit Board (PCB) accommodation space and an open end of the inverter housing closable by a removable cover. The inverter housing is connected to the compressor housing and is grounded directly or via the compressor housing. The inverter unit includes an inverter that is configured with a Printed Circuit Board, hereinafter referred to as PCB and a power module received inside the inverter housing. The PCB and the power module are functionally coupled to the electric motor received in the main housing to drive the electric motor in a controlled manner. Specifically, the PCB accommodation space is disposed adjacent to the electric motor receiving portion of the main housing, when the inverter housing is assembled to the main housing. The power module generates heat during operation thereof. The heat generated may cause damage to the power module due to fusing of critical elements of the power module, breakage or failure of the power module due to reduced mechanical strength of critical elements thereof at elevated temperatures. To prevent the problems arising due to the heating of the power module, it is required to dissipate heat from the power module for preventing breakage or failure of the power module and ensuring efficient performance of the power module. The power module is urged against an end wall of the inverter housing for heat dissipation from the power module due to refrigerant received by the motor accommodating space of the main housing being in contact with the end wall carries away the heat from the end wall. The PCB includes a plurality of electronic components for performing inverter operation and controlling motor in various aspects by giving controlled input to the electric motor. The cover of the inverter housing is also made of a metallic material Referring to the FIG. 1 of the accompanying drawings, the power module 2 held inside the inverter housing and mounted on an end wall 4 of the inverter housing is illustrated. The power module 2 includes a plurality of switching elements that are molded in a casing of the power module 2. The switching elements include lead frames 3 that protrude out of the casing of the power module and are connected with the PCB, so that DC high voltage power, low voltage signals and AC output can be supplied to corresponding portions in the PCB. Therefore some of the lead frames 3 can be high voltage portions. The power module 2 is mounted on and urged against the end wall 4 of the inverter housing by means of a metal bolt 6 and a metal washer 8. The bolt 6 is a threaded bolt that includes a threaded shaft portion 6a and a bolt head 6b. The bolt head 6b along with the washer 8 urges power module 2 against the end wall 4 of the inverter housing as the threaded shaft portion 6a engages with the end wall 4. More specifically, the washer 8 includes a hole 8a to allow passage of the threaded shaft portion 6a therethrough, whereas the bolt head 6b rests on the washer 8. Also, the casing of the power module 2 includes a through hole 2b to allow passage of the threaded shaft portion 6a therethrough. The threaded shaft portion 6a of the bolt 6 passes through holes 8a and 2b formed on the washer 8 and the power module 2 respectively to engage with a blind hole formed on the end wall 4. As the threaded shaft portion 6a engages with the blind hole on the end wall 4, the washer 8 and the power module 2 is disposed between the bolt head 6b and the end wall 4. As a result, the power module 2 is secured to the end wall 4 of the inverter housing by fastening the bolts 6. With such configuration, the power module 2 is maintained insufficient contact with the end wall 4 for better heat dissipation. Particularly, with such configuration, the power module 2 is pressed against the end wall 4 with an intention to address insulation issues arising due to any air gap between the power module 2 and the end wall 4.

With the washer 8 disposed between the bolt head 6b and the power module 2 and the threaded shaft portion 6a engaging with the end wall 4, the power module 2 is securely urged against the end wall 4 by the bolt head 6b without being scratched/damaged by the bolt head 6b. Generally, the washer 8 is used to protect the power module 2 from damage by the bolt head 6b during screwing of the bolt 6 to the end wall 4. Further, in the exemplified power module 2 includes dummy frames provided in the casing to relay the conductive connection between some of the lead frames and the switching elements. Part of the edges of the dummy frames remain exposed from one side of the casing. The exposed portions 2a of the dummy frames are not connected to any of electric components and also act as the high voltage portions. Insufficient creepage distance between the high voltage portions 2a, 3 and other conductive/grounded elements can cause short circuit there-between, The creepage distance is length of shortest path followed by current to reach a conductive/grounded element. In case of the conventional mounting arrangement for mounting the power module 2 to the end wall 4, the end wall 4 of the inverter housing is grounded, the bolt 6 is threadbly engaged with the end wall 4 and the metallic washer 8 is in contact with the bolt head 6b of the metallic bolt 6. Accordingly, the washer 8 is also conductively connected to the ground through the bolt 6. In such scenario, the washer 8 acts conductive element that could cause short circuit between itself and the high voltage portions 2a, 3, due to insufficient creepage distance between the washer 8 and the high voltage portions 2a, 3. The FIG. 1 depicts creepage distance "d" between the high voltage elements 2a, 3 and the washer 8. The creapage distance is measured from the outer periphery of the washer 8 and the closest high voltage portions 2a, 3. Requirement for creepage distance "d" is much shorter than one for spatial distance. The problem of short circuit due to insufficient creepage distance "d" between the high voltage portions 2a, 3 of the power module 2 and the washer 8 is aggravated when the high voltage elements 2a, 3 remain exposed from at least one side of the power module 2. In case washer 8 is not disposed between the bolt head 6b and the power module 2, there are still risks of short circuit between the High Voltage (HV) elements 2a of the power module 2 and the bolt head 6b.

Accordingly, The conventional arrangement fails to provide sufficient creepage distance "d" between high voltage (HV) portions of the power module 2 and the washer 8 and/or bolt head 6b, thereby causing problems. More specifically, in case of the conventional configuration, the creepage distance "d" between the high voltage (HV) elements 2a of the power module 2 and the washer 8 and/or bolt head 6b is below the standard safety requirement for efficient and safe operation of the power module 2.

Accordingly, there is a need for an inverter unit that is configured with an arrangement for increasing creepage distance between high voltage elements of a power module and a washer and/or head portion of a bolt for mounting the power module to an end wall of an inverter housing.

OBJECTS

A principal object of the present invention is to provide an inverter unit configured with an arrangement that obviates the problems faced by the conventional inverter units due to insufficient creepage distance between critical elements of the inverter unit.

Another object of the present invention is to provide an inverter unit with power module thereof mounted over and urged against an end wall of an inverter housing to achieve efficient heat dissipation from the power module due to refrigerant in main housing being in contact with the end wall.

Yet another object of the present invention is to provide an inverter unit that is convenient to assemble.

In the present description, some elements or parameters may be indexed, such as a first element and a second element. In this case, unless stated otherwise, this indexation is only meant to differentiate and name elements which are similar but not identical. No idea of priority should be inferred from such indexation, as these terms may be switched without betraying the invention. Additionally, this indexation does not imply any order in mounting or use of the elements of the invention.

SUMMARY

An inverter unit is disclosed in accordance with an embodiment of the present invention. The inverter unit includes an inverter, an inverter housing and an insulating member. The inverter drives an electric motor and includes at least one power module for converting a High Voltage (HV) Direct Current (DC) to a three-phase Alternating Current (AC) that drives the electric motor. The inverter housing receives the inverter. The power module is mounted on an end wall of the inverter housing by means of bolts. The insulating member corresponding to each bolt is disposed between head portion of the bolt and the power module.

Generally, the end wall defines a closed end of the inverter housing formed with holes to configure threaded engagement with the corresponding bolts.

Preferably, the insulating member includes a base portion. The power module is securely mounted to the base portion and the end wall of the inverter housing by means of bolts. A threaded shaft portion of the bolt axially passes through a hole formed on the base portion and the cut outs provided on the power module and engages with the end wall. The head portion of the bolt remains above the base portion such that the base portion is disposed between and separates the head portion of the bolt and the power module.

Specifically, the base portion of the insulating member is having a radial dimension greater than the radial dimension of the head portion of the bolt to define annular space there-between.

Generally, the hole is centrally disposed with respect to the base portion.

Further, the insulating member includes a side wall axially extending from the base portion and away from the power module to increase the creepage distance between the head portion of the bolt and high voltage elements of the power module.

Further, the sidewall of the insulating member is having a height at least two times the height of the head portion of the bolt.

In accordance with another embodiment of the present invention, at least one of the insulating members is overmolded with the corresponding bolt and integrally formed therewith.

In accordance with an embodiment of the present invention, the sidewall is of uniform height along a periphery of the base portion.

In accordance with another embodiment of the present invention, at least a portion of the sidewall of the insulating member is inclined with respect to the central axis "C".

Further, at least one of inside and outside surface of the sidewall is an irregular surface.

Generally, the insulating member is of hollow configuration with a circular cross section.

Furthermore, the inverter of the inverter unit includes a Printed Circuit Board (PCB) and a separator disposed between the power module and the removable cover.

Generally, the PCB includes a plurality of electronic components mounted thereon and the separator separates the electronic components.

Also, the power module is connected to the PCB via pins emanating therefrom.

Generally, the PCB and the separator includes corresponding first openings and the second openings for passage of the insulating member therethrough.

In accordance with another embodiment of the present invention, the separator includes the insulating member integrally formed therewith.

Furthermore, the bolt is deployed using a deploying tool selected from a group including screwdriver, alley key.

Also is disclosed a motor driven compressor in accordance with an embodiment of the present invention. The motor driven compressor includes a compression unit, an electric motor and an inverter unit. The compression unit compresses fluid. The electric motor drives the compression unit. The inverter unit as disclosed above drives the electric motor.

BRIEF DESCRIPTION

Other characteristics, details and advantages of the invention can be inferred from the description of the invention hereunder. A more complete appreciation of the invention and many of the attendant advantages thereof will be readily obtained as the same becomes better understood by reference to the following detailed description when considered in connection with the accompanying figures, wherein:

FIG. 5 illustrates an isometric view of the power module of FIG. 3 with pins emanating there from;

FIG. 7 illustrates an isometric view of an insulating member in accordance with another embodiment of the present invention, wherein the insulating member is over-molded with a corresponding bolt and integrally formed there-with;

It must be noted that the figures disclose the invention in a detailed enough way to be implemented, said figures helping to better define the invention if needs be. The invention should however not be limited to the embodiment disclosed in the description.

DETAILED DESCRIPTION

The present invention is described with example of inverter unit for a motor-driven compressor of a vehicle air-conditioning system. However, the present invention is also applicable to any electronic system used in vehicular and non-vehicular applications.

Figure 2:
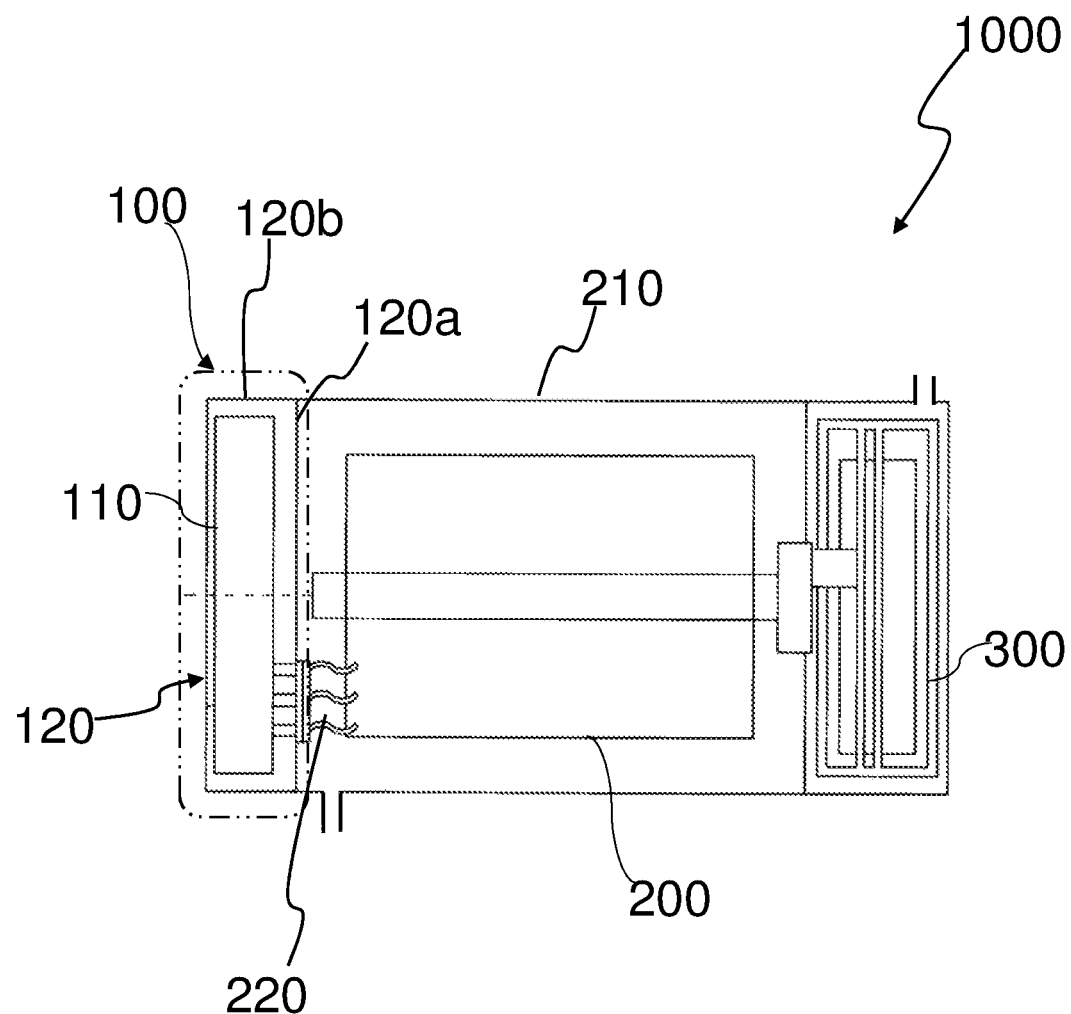
FIG. 2 illustrates a schematic representation of a motor-driven compressor for an air-conditioning system of the present invention.

FIG. 2 illustrates a schematic representation of a motor-driven compressor 1000 for a vehicle air-conditioning system in accordance with an embodiment of the present invention. The motor-driven compressor 1000 includes an inverter unit 100, an electric motor 200 and a compression unit 300 driven by the electric motor 200 for compressing refrigerant. The motor driven compressor 1000 further includes a main housing also referred to as compressor housing 210 and a separate inverter housing 120. The main housing or the compressor housing 210 accommodates the electric motor 200 and the compression unit 300. The inverter housing 120 accommodates an inverter 110. The compressor housing 210 is made of metal such as aluminium and is generally grounded to the vehicle via a mounting portion (not shown).

The inverter housing 120 includes an end wall 120a, a peripheral wall 120b extending from the periphery of the end wall 120a to define a PCB accommodation space and an open end of the inverter housing 120. The inverter housing 120 is connected to the main housing 210 and is also grounded via the compressor housing 210. The open end of the inverter housing 120 is closable by a removable cover 120c. The inverter 110 is functionally coupled to the electric motor 200 received in the main housing 210 to drive the electric motor 200 in a controlled manner. Specifically, the PCB accommodation space is disposed adjacent to the electric motor receiving portion of the main housing 210 when the inverter housing 120 is assembled to the main housing 210 and the inverter 110 is functionally connected to the electric motor 200 via an electrical connection interface 220 provided through the end wall 120a. With such configuration of the PCB accommodating space and the electric motor receiving portion of the main housing 210 disposed adjacent to each other, the cooling fluid, particularly, the refrigerant received in the motor receiving portion also cools the end wall 120a as the end wall 120a of the inverter housing 120 is in contact with the main housing 210 cooled by the refrigerant.

Figure 3:
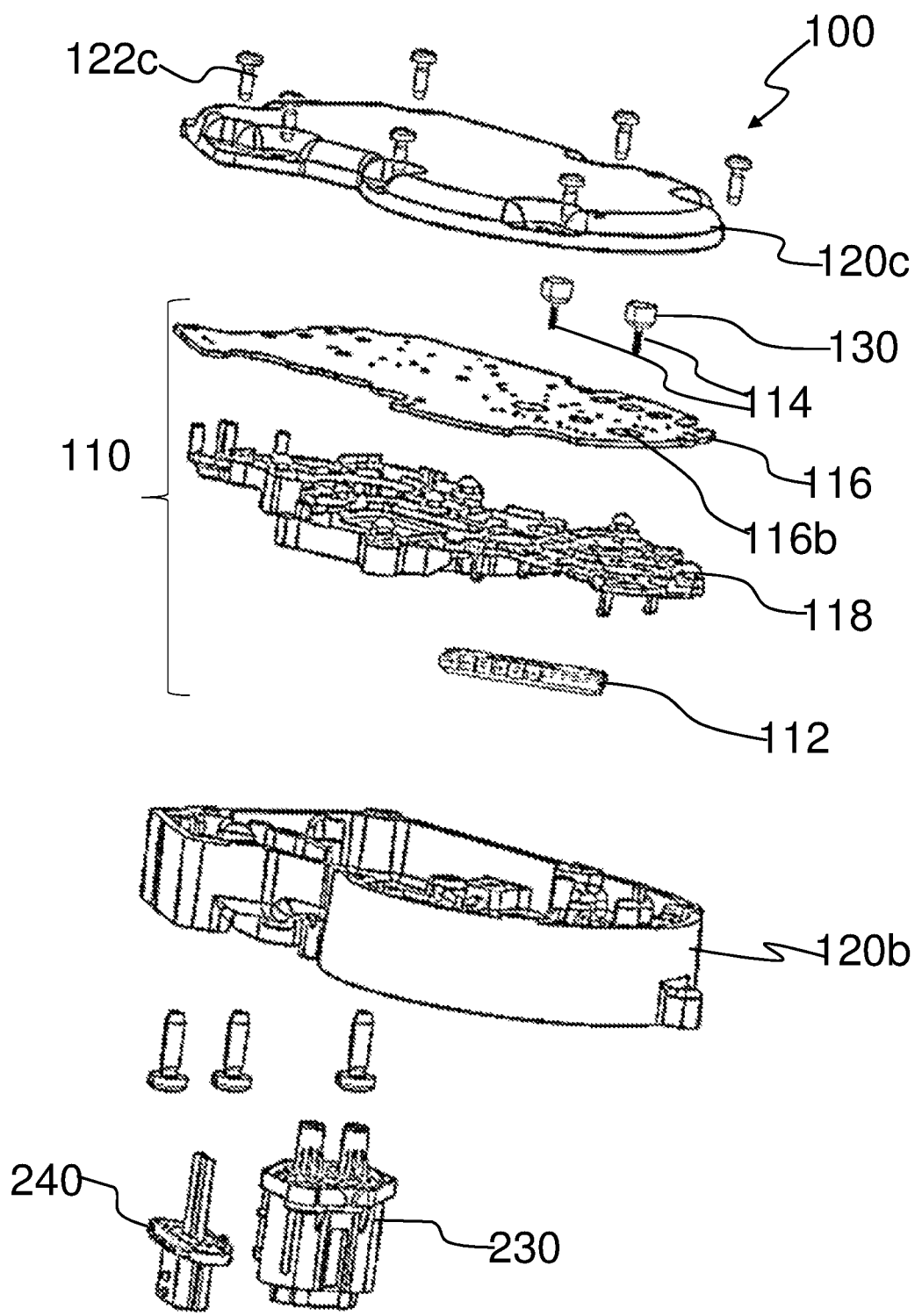
FIG. 3 illustrates an exploded view of an inverter unit of the motor-driven compressor of FIG. 2 depicting a power module, PCB, separator, insulating members and a bolt assembly of the inverter unit.

FIG. 3 of the accompanying drawings illustrates an exploded view of the inverter unit 100 of one embodiment. The inverter unit 100 is composed of the inverter housing 120 and the inverter 110 accommodated in the inverter housing 120. The inverter 110 includes at least one power module 112 and a PCB 116 which includes a plurality of electronic components disposed thereon. Further, the inverter unit 100 includes a High Voltage (HV) connector 230 and a Low Voltage (LV) connector 240 that are provided on the end wall 120a of the inverter housing 120 so as to receive high voltage power supply and control signal from the vehicle systems. The inverter 110 drives the electric motor 200 and includes the power module 112 for converting a High Voltage (HV) Direct Current (DC) to a three-phase Alternating Current (AC) that drives the electric motor 200.

Figure 4:
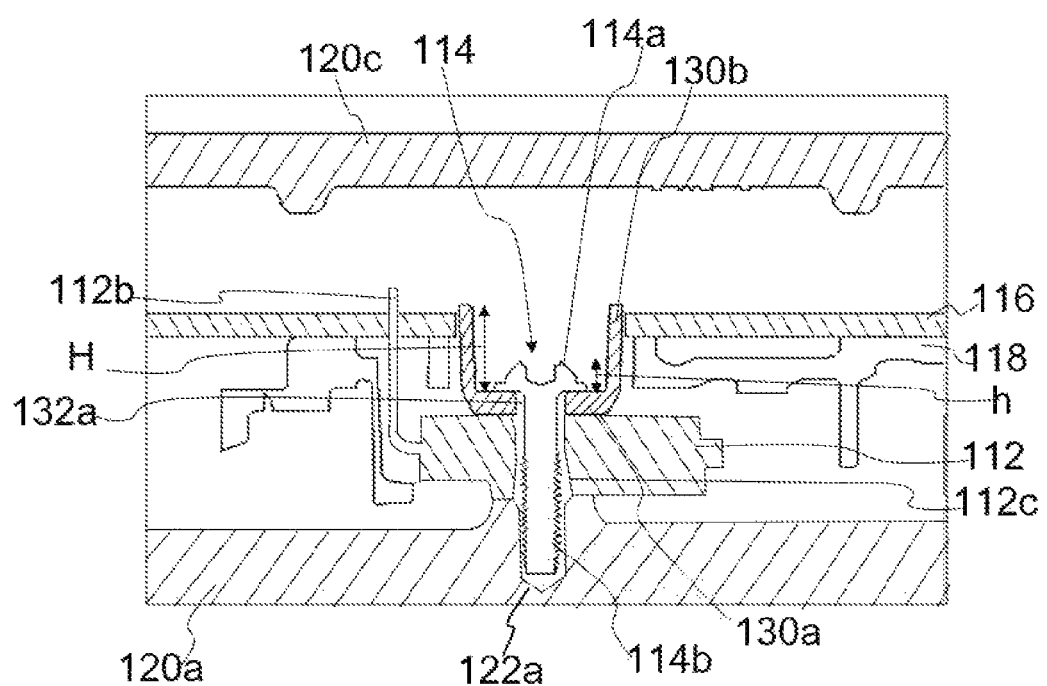
FIG. 4 illustrates cross sectional view of the inverter unit along a section plane passing through one of the bolts and depicting the section of the power module, insulating members and bolt assembly of FIG. 3.

FIG. 4 illustrates cross sectional view depicting the assembly of the power module 112, insulating members 130 and the bolt 114 along a section plane passing through one of the bolts 114. As depicted in FIG. 4, the power module 112 is mounted on the end wall 120a of the inverter housing 120. The end wall 120a of the inverter housing 120 is formed with holes 122a to receive and configure threaded engagement with corresponding threaded portions 114b of the bolts 114. In one embodiment, the holes 122a are blind holes without threads formed thereon and the bolts 114 are self-tapping bolts that form threads on the holes 112a as the bolts are deployed. Alternatively, holes 112a are threaded holes and the bolts 114 are screwed into the threaded holes 122a to urge the power module 112 against the end wall 120a of the inverter housing 120 to improve a surface contact between the power module 112 and the end wall 120a and enhance the heat dissipation from the power module 112. The bolt 114 is deployed using a deploying tool selected from a group comprising of screwdriver, alley key or any other device that can operate in limited space around the bolt head. Further, in the present invention, the insulating member 130 is disposed between the power module 112 and a bolt head 114a of the bolt 114.

Figure 5:
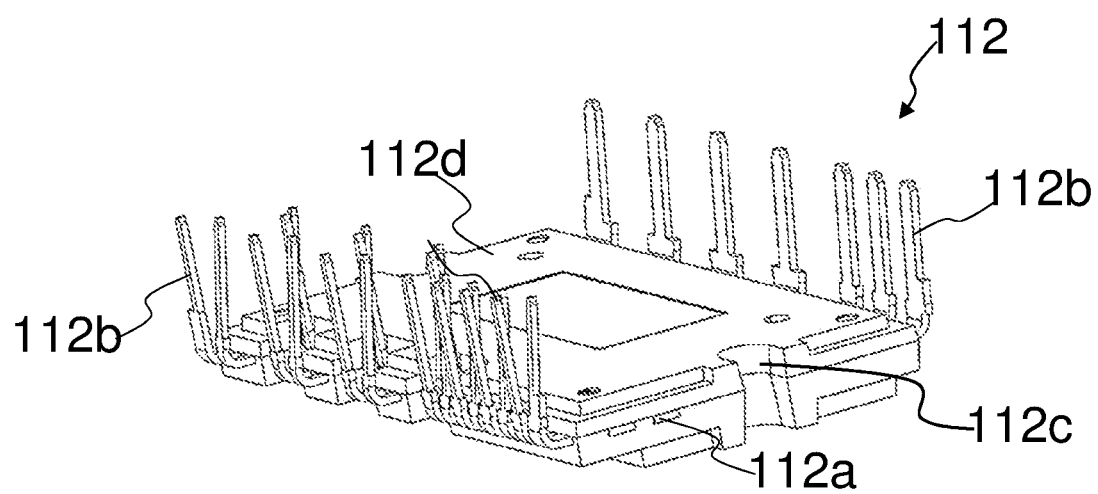

FIG. 5 illustrates an isometric view of the power module 112 of an embodiment. The power module 112 includes a casing 112d which has a shape of a rectangular box. The casing 112d is made of non-conductive material such as resin. A plurality of switching elements are disposed inside and covered by the casing 112d of the power module 112. Specifically the switching elements are molded in the resin casing 112d. A plurality of lead frames or pins 112b which conductively connect the switching elements extend out of the casing 112d from opposite longer sides of the rectangular casing 112d thereof. The lead frames or pins 112b are made of conductive material such as copper. In accordance with one embodiment depicted in the FIG. 5, six lead frames 112b extend out from a first longer side of the casing 112d and twenty lead frames or pins 112b extend out from a second longer side of the casing 112d, wherein the second longer side is opposite to the first longer side. The lead frames or pins 112b are bend at right angle so as to be able to be connected to the PCB 116. High voltage power from the vehicle battery is supplied to the switch elements via some of the lead frames or pins 112b. Further control signal is supplied to the switching elements via the other of the lead frames or pins 112b, hence the power module 112 can convert direct current (DC) to alternating current (AC). The lead frames or pins 112b to which the high voltage power is supplied from the battery can be high voltage portions.

Again referring to the FIG. 5, the casing 112d of the power module 112 further includes cut outs 112c formed on opposite shorter sides thereof for the passage of the bolts 114 for mounting the power module 112 on the end wall 120a. Generally, the cutouts 112c are disposed at the centre of the shorter sides of the casing 112d. Further, in this example, dummy frames are provided in the casing 112d so as to relay the conductive connection between some of the lead frames or pins 112b and the switching elements. Part of the edges of the dummy frames remain exposed from the shorter side of the casing 112d of the power module 112 and act as high voltage portions 112a. The exposed portions of the dummy frames are not connected to any of electric components but they also can be the high voltage portions 112a. The lead frames or pins 112b can also be considered as the high voltage elements.

Figure 6A:
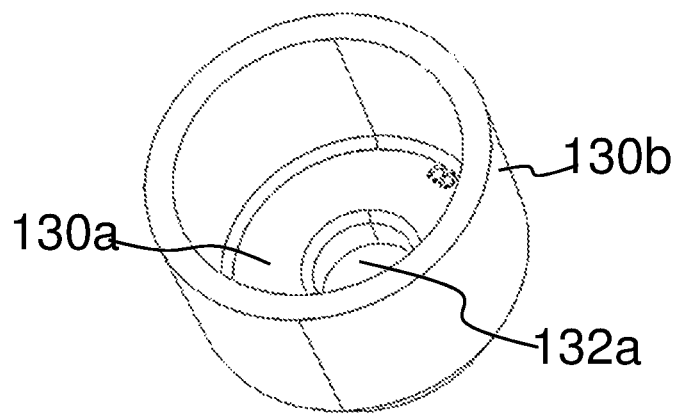
FIG. 6a illustrates an isometric view of the insulating member of the FIG. 3.
Figure 6B:
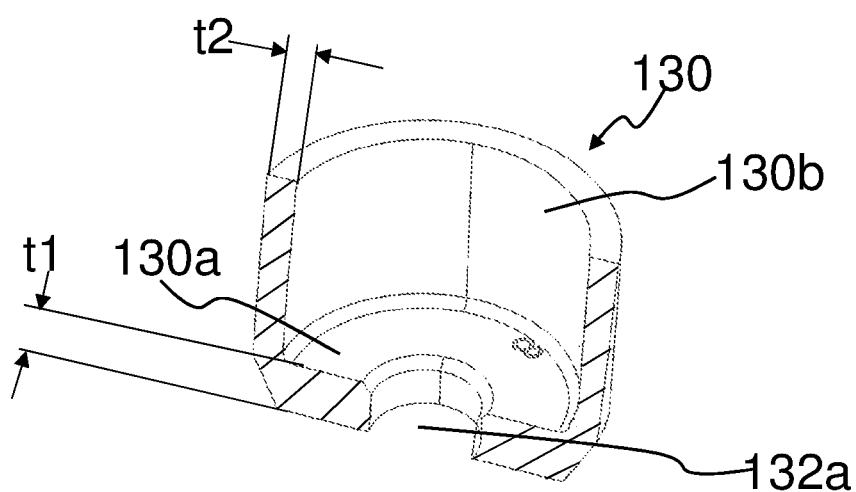
FIG. 6b illustrates a sectional view of the insulating member of the FIG. 3.

FIG. 6a and FIG. 6b depict the insulating member 130 of an embodiment. The insulating member 130 includes the base 130a having a uniform thickness "t1". A hole 132a is formed at the centre of the base 130a. Preferably, the insulating member 130 is a cylindrical element with one closed end and an opposite open end. Specifically, the insulating member 130 is in form of a cup that includes the base 130a and the peripheral wall 130b extending from the base 130a. The peripheral wall 130b is having thickness "t2". The insulating member 130 is made of non-conductive material such as resin.

Figure 7:
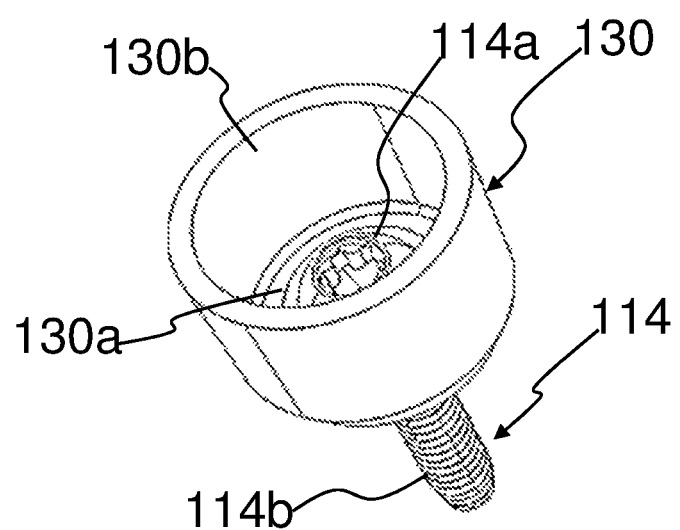

In accordance with another embodiment of the present invention as illustrated in FIG. 7, at least one of the insulating members 130 is over-molded with the corresponding bolt 114 and integrally formed there-with. In such configuration, the bolt head 114a remains above the base 130a of the insulating member 130, whereas the threaded shaft portion 114b of the bolt 114 depends from the base 130a of the insulating member 130. In such configuration, the insulating member 130 rotates with the bolt 114 as the bolt 114 is deployed to engage with the holes 122a formed on the end wall 120a.

As mentioned above, the power module 112 is mounted on the end wall 120a of the inverter housing 120 by means of the bolts 114. Further the insulating members 130 is disposed between the power module 112 and the bolt head 114a of the bolt 114 as the bolt 114 engages with the end wall 120a for mounting the power module 112 to the end wall 120a and urging the power module 112 to the end wall 120a. Particularly, the power module 112 is securely mounted to the end wall 120a by means of bolts 114 such that base 130a is on one side of the power module 112 and the end wall 120a of the inverter housing 120 is on the other side of the power module 112. Specifically, a threaded shaft portion 114b of the bolt 114 axially passes through the hole 132a of the base 130a and the cut outs 112c provided on the power module 112 and engages with the end wall 120a, while the head portion 114a of the bolt 114 remains above the base 130a. Since the base 130a is disposed between the head portion 114a of the bolt 114 and the power module 112, the head portion 114a of the bolt 114 and the power module 112 don't contact with each other. In this example, two bolts 114 mount the opposite sides of the power module 112 to the end wall 120a of the inverter housing 120. However, the present invention is not limited to any particular number and placement of the bolts as long as the corresponding insulating member 130 is disposed between the bolt head 114a of each bolt 114 and the power module 112.

As mentioned in background, the bolts 114 are engaged with the end wall 120a which is grounded. If a part which is disposed between the bolt head 114a and the power module 112 were a metal washer 8 as is in the case of the conventional arrangement, a creepage distance to be considered is a distance between the high voltage portion of the power module and the outer periphery of the metal washer which contacts with the head portion 114a of the bolt 114. However, in case of the mounting arrangement for the inverter unit 100 configured with insulating elements, the creepage distance "D" between the high voltage portions 112a of the power module 112 and the bolt head 114a is increased because of the peculiar cup shape configuration of the insulating elements 130.

Figure 8:
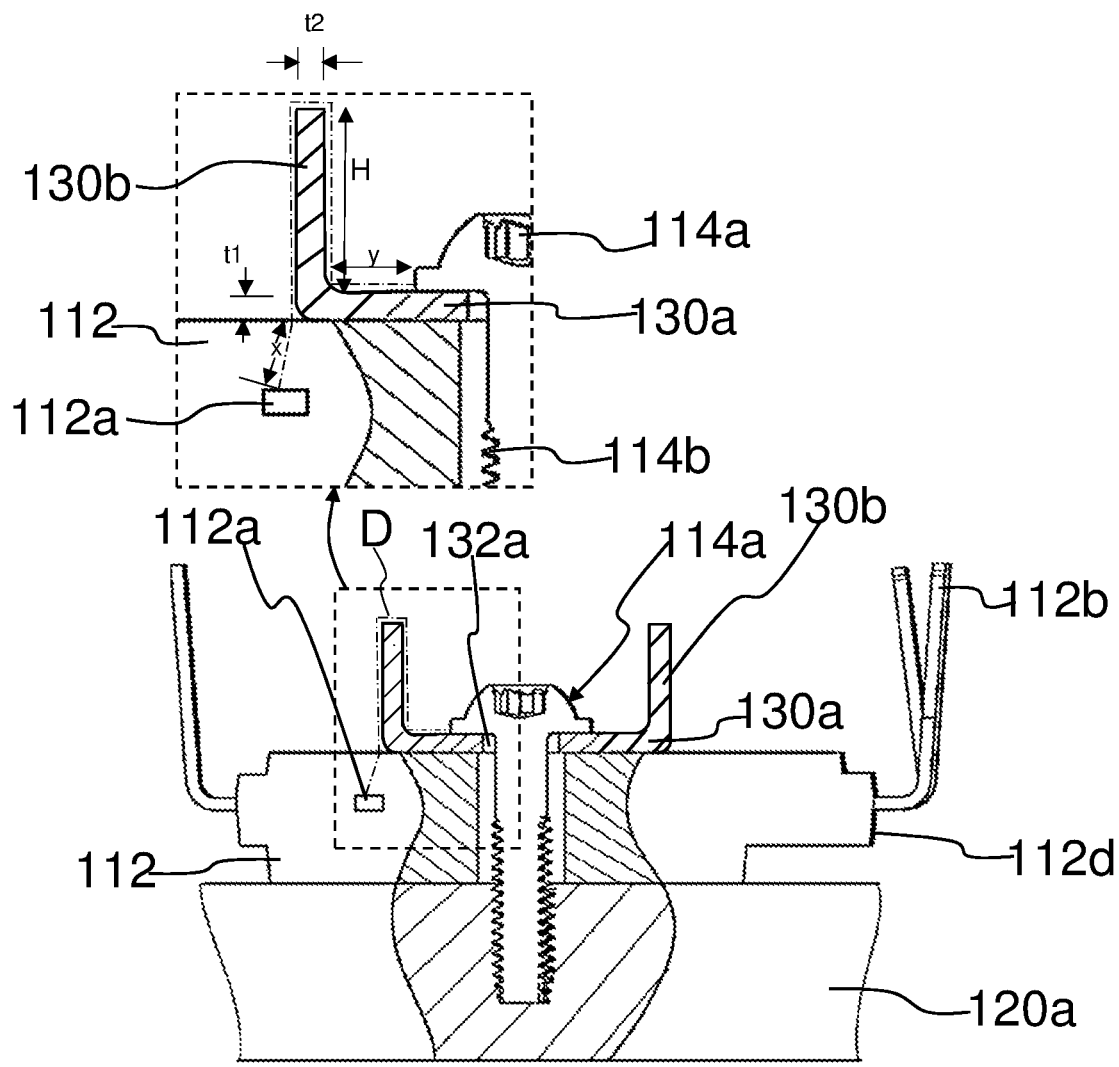
FIG. 8 illustrates a schematic representation of a mounting arrangement for the inverter unit of the present invention configured with insulating members of FIG. 3, also is depicted an enlarged view depicting a creepage distance between a bolt head and high voltage elements of the power module.

FIG. 8 illustrates a schematic representation of a mounting arrangement for the inverter unit 100 configured with the insulating member 130. Also is depicted an enlarged view depicting the creepage distance "D" between the bolt head 114a and the high voltage portion 112a of the power module 112. As depicted the creepage distance D is calculated as sum of all distances between the high voltage portions 112a and the bolt head 114a. Particularly, the creepage distance is sum of the distance "x" from the high voltage portions 112a to the insulating member 130 along outside surface of the power module 112 and the length of the path followed by current from a point at which the current leaves from an exterior to the power module 112 to the bolt head 114a along inside, outside surfaces of the insulating member 130. The length of the path followed by the current to reach the bolt head 114a from the exterior of the power module 112 includes a first thickness "t1" of a base portion 130a, also, referred to as base 130a, the length of portion of the path along outside surface of a peripheral wall 130b that is equal to the height "H" of the peripheral wall 130b, a second thickness "t2" of the peripheral wall 130b, the length of portion of the path along inside surface of the peripheral wall 130b that is again equal to the height "H" of the peripheral wall 130b and the distance between the inside surface of the peripheral wall 130b and the bolt head 114a, particularly, the creepage distance is measured as follows, $$D = x + t1 + H + t2 + H + y$$

the creepage distance D in case of the mounting arrangement of the inverter unit 100 of the present invention with the insulating member 130 is more than the creepage distance d in case of the mounting arrangement of the conventional inverter unit without the insulating member, D>>d. The interface of the base 130a and the peripheral wall 130b is formed with a fillet.

Figure 1:
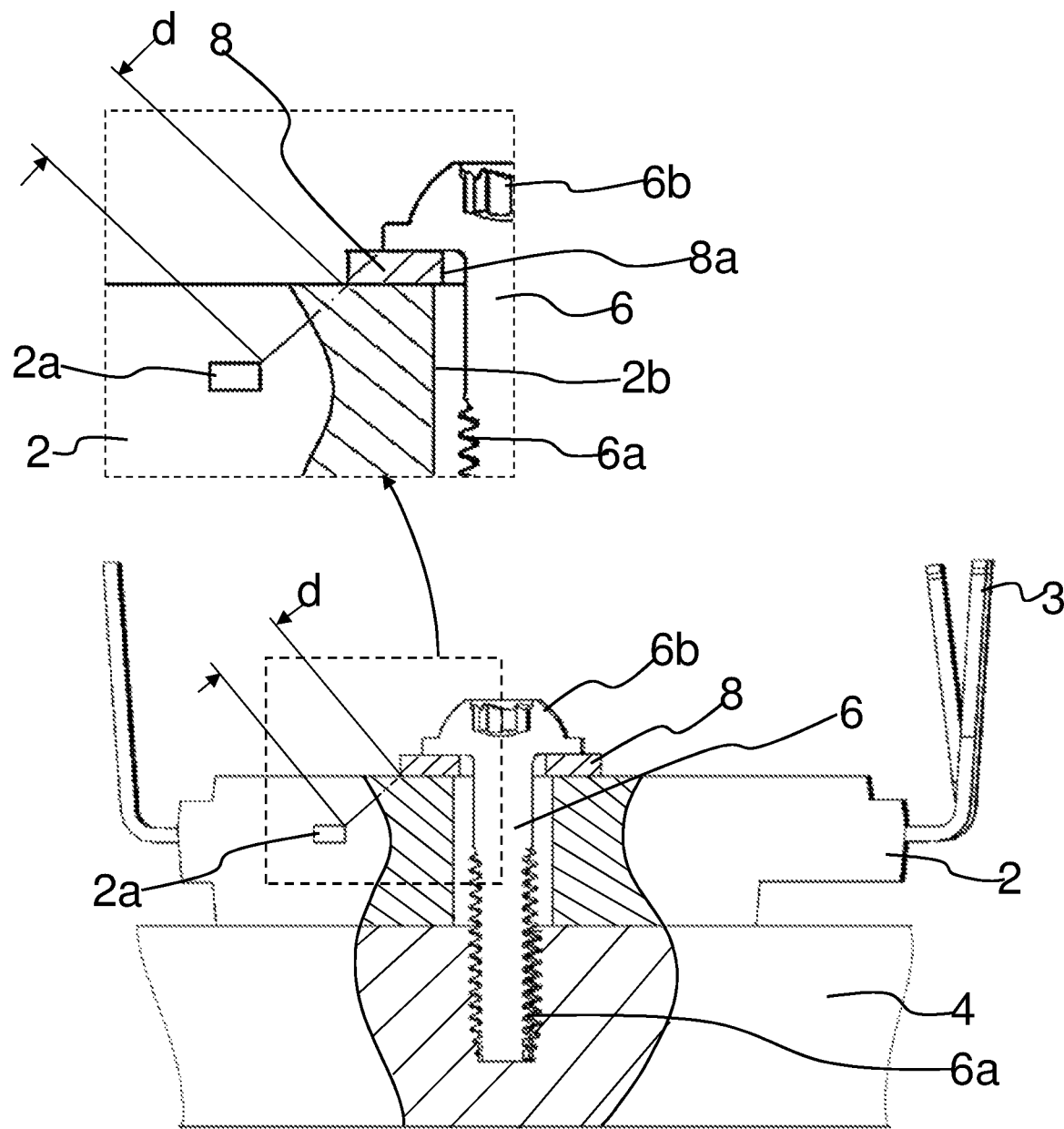
FIG. 1 illustrates a schematic representation of a conventional mounting arrangement of a bolt and a washer for mounting a power module to an end wall of an inverter housing of an inverter unit, also is depicted an enlarged view depicting a creepage distance between the washer and the high voltage elements of the power module.

In case of the inverter unit 100 of the present invention, power module 112 of which a dummy frame is exposed on the shorter end of the casing 112d, the creepage distance "D" is calculated from the high voltage portion 112a to the bolt head 114a along the peripheral walls 130b of the insulating member 130. The creepage distance "D" as illustrated in FIG. 8 and in the description of FIG. 8 includes length of the current flow path along inside and outside surface of the insulating member 130 along with wall thicknesses and is larger than the creepage distance "d" between the high voltage portion of the power module and the outer periphery of the washer 8 of the conventional inverter unit as illustrated in FIG. 1.

In the conventional configuration of the inverter unit with the washer disposed between the bolt head and the end wall, it would be hard to secure a sufficient creepage distance. However, in the present invention, a part disposed between the head portion 114a of the bolt 114 and the power module 112 is the insulating member 130. As the insulating member 130 is non-conductive part, a creepage distance is a distance from the high voltage portions 112a, 112b and the free surface of the power module 112 along with the distance the current has to traverse along the surface of the insulating member 130 to reach the bolt head 114a.

The creepage distance "D" between the high voltage portions 112a of the power module 112 and the bolt head 114a can be increased by modifying the insulating elements 130. For example, the corresponding bolt 114 for mounting the power module 112 to the end wall 120a of the inverter housing 120 includes the bolt head 114a and the threaded shaft portion 114b. The diameter of the base 130a or internal diameter of hollow cylinder defined by the peripheral wall 130b of the insulating element 130 is greater than the diameter of the bolt head 114a and circumscribes the bolt head 114a to define annular space there-between. The annular space between the bolt head 114a and the internal diameter of the hollow cylinder defined by the peripheral wall 130b is in direct relation with the creepage distance. More specifically, the creepage distance increases with the annular spacing between the bolt head 114a and the internal diameter of the hollow cylinder defining the peripheral wall 130b. The peripheral wall 130b of the insulating member 130 is of a height at least two times the height of the bolt head 114a. Again referring to the FIG. 4 of the accompanying drawings, if the height of the peripheral wall 130b is represented by "H" and the height of the bolt head 114a is represented by "h", then H=4h. The difference in height between the peripheral wall 130b of the insulating member 130 and the bolt head 114a of the bolt 114 is in direct relation with the creepage distance. More specifically, the creepage distance increases with the increase in difference in height between the peripheral wall 130b and the bolt head 114a. The side wall can have different configurations in order to increase the creepage distance. In accordance with an embodiment, the sidewall 30b is of uniform height along a periphery of the base 130a. In accordance with another embodiment, at least a portion of the peripheral wall 130b of the insulating member 130 is inclined with respect to the central axis "C" to increase the creepage distance between the high voltage portions 112a of the power module 112 and the bolt head 114a. In accordance with one embodiment, both the inside and outside surface of the peripheral wall 130b is smooth surface.

Figure 9:
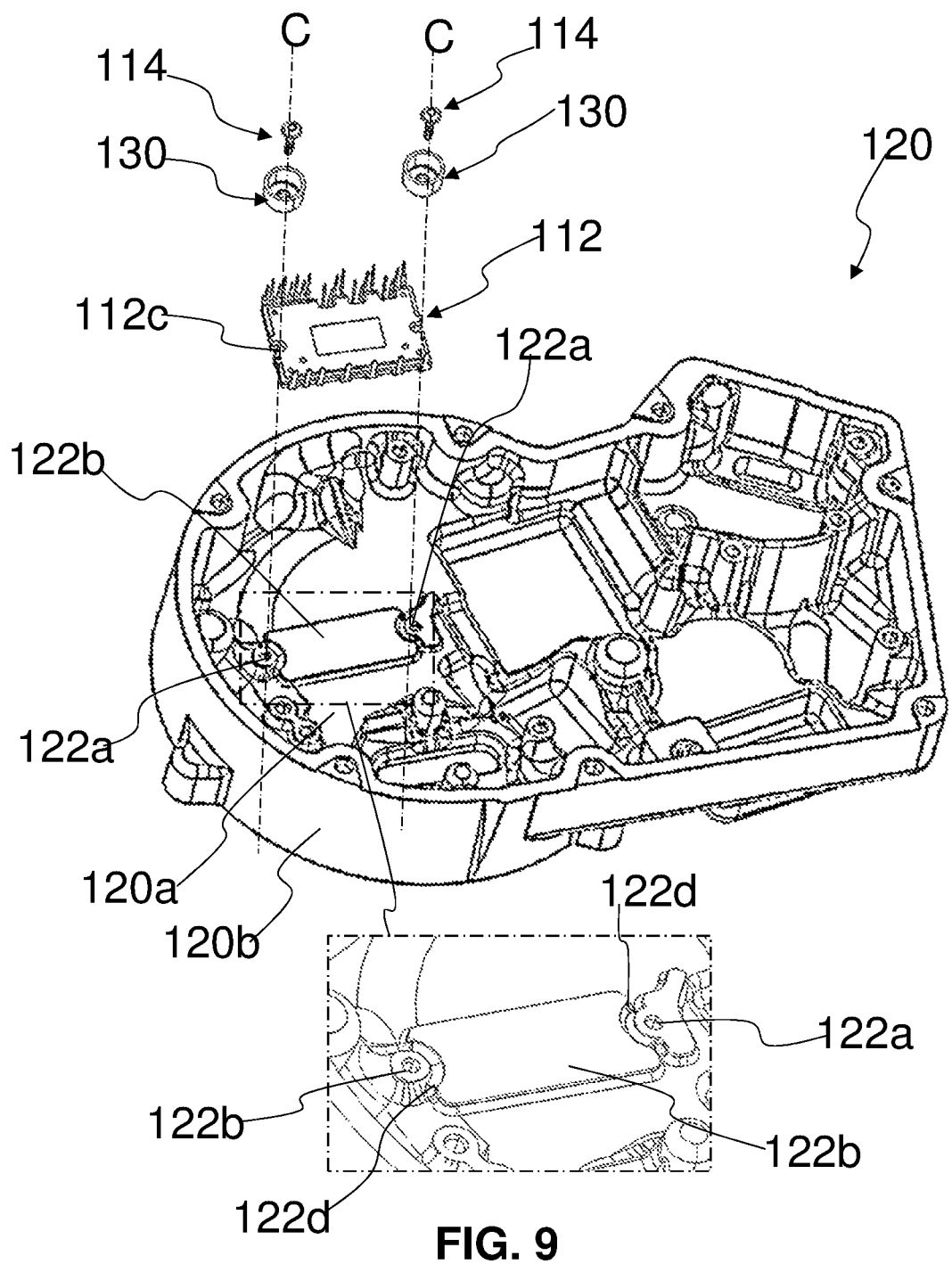
FIG. 9 illustrates an exploded view depicting assembly between the power module, insulating members and bolt assembly of FIG. 3 and the end wall of an inverter housing, also is depicted an enlarged view depicting a flat platform formed on the end wall.
Figure 10:
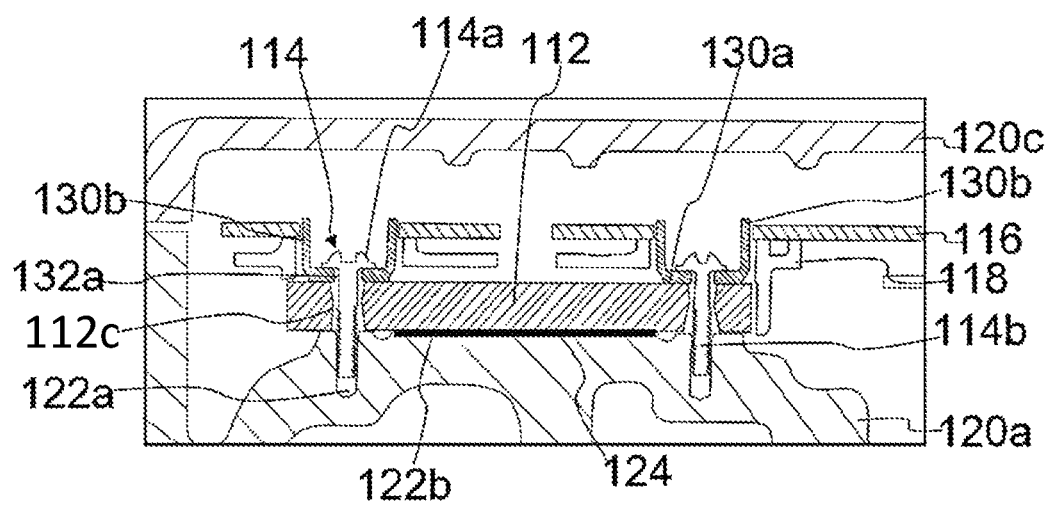
FIG. 10 illustrates cross sectional view depicting the inverter unit of FIG. 3 along a section plane passing through both the bolts.

Referring to the FIGS. 9 and 10, the arrangement of mounting the power module 112 to the end wall 120a by means of the bolts 114 and corresponding insulating members 130 is depicted. More specifically, the threaded shaft portion 114b of the bolt 114 axially passes through the hole 132a formed on the base 130a of the insulating members 130 and engages with the holes 122a formed on the end wall 120a while the bolt head 114a remains above the base 130a. The threaded shaft portion 114b of the bolts 114 passes through the respective cut-outs 112c formed on the power module 112 and are received in corresponding holes 122a formed on the end wall 120a to mount the power module 112 to the end wall 120a. More specifically, the end wall 120a of the inverter housing 120 is formed with the holes 122a to receive and configure threaded engagement with the corresponding bolts 114. Further, such configuration of mounting the power module 112 over the end wall 120a of the inverter housing using bolts 114 urges the power module 112 against the end wall 120a and results in improved heat dissipation from the power module 112. Such configuration addresses insulation issues arising due to any air gap between the power module 112 and the end wall 120a. The base 130a further provides sufficient support and surface contact for the bolt head 114a, thereby improving threaded engagement of the bolt 114 with the end wall 120a.

FIG. 9 illustrates an exploded view depicting the assembly of the power module 112, the insulating member 130 and the bolt 114 along with the end wall 120a of the inverter housing 120. In order to further improve the surface contact between the power module 112 for improved heat dissipation from the power module 112, the end wall 120a includes a flat platform 122b formed thereon. FIG. 9 also depicts an enlarged view depicting the flat platform 122b formed on the end wall 120a. The holes 122a to receive and engage with the bolts 114 are disposed along the periphery of the flat platform 122b, particularly, on opposite shorter sides thereof. The flat platform 122b is complimentary to the power module 112 in shape and size to enhance surface contact of the end wall 120a with the power module 112. Generally, a gap filler 124 is disposed between the power module 112 and the flat platform 122b to further improve the surface contact between the power module 112 and the end wall 120a and heat dissipation from the power module 112 when the power module 112 is mounted over the flat platform 122b using the bolts 114. Particularly, the gap filler 124 fills the small gaps, such as for example, gaps due to roughness and geometrical defects of the power module 112 and the end wall 120a. Further, as the gap filler 124 has a better thermal conductivity than air, the gap filler 124 allows improved thermal flow between the power module 112 and the end wall 120a. FIG. 10 illustrates cross sectional view depicting the assembly of the power module 112, insulating members 130 and bolts 114 along a section plane passing through both the bolts 114. Also is depicted the gap filler 124 disposed between the flat platform 122b formed on the end wall 120a and bottom surface of the power module 112 to increase the surface contact between the power module 112 and the end wall 120a. With such configuration, improved heat dissipation from the power module 112 is achieved as the power module 112 is urged against the flat platform 122b formed on the end wall 120a by means of the bolts 114. With such configuration, the surface contact between the power module 112 and the end wall 120a is improved, thereby enhancing the heat dissipation. More specifically, with such configuration, the heat generated by the power module 112 is efficiently rejected to the refrigerant on the other side of the end wall 120a. In accordance with an embodiment, a groove 122d is provided between the holes 122a and the corresponding shorter side of the flat platform 122b to accommodate any excess gap filler that is forced outwardly when the power module 112 is urged against the flat platform 122b by the bolts 114.

Figure 11:
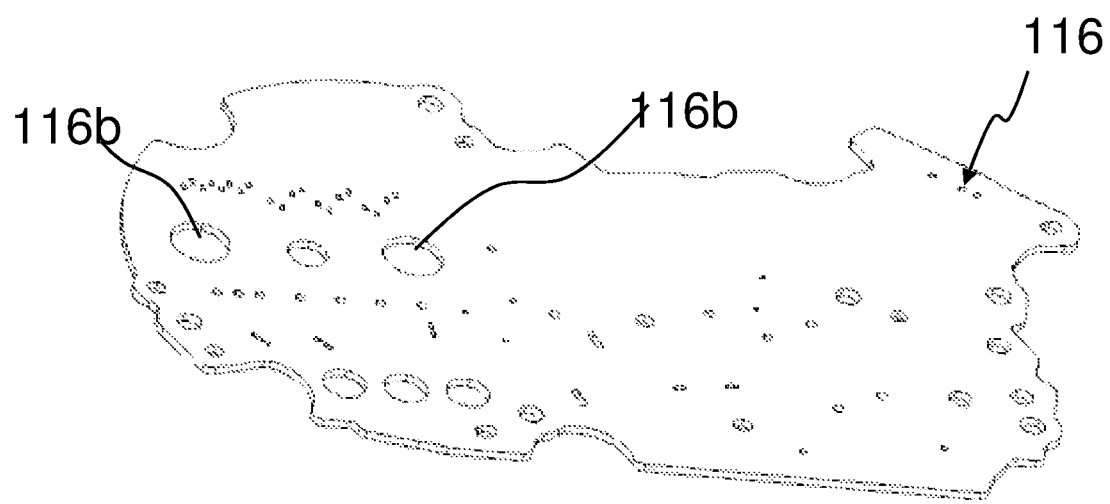
FIG. 11 illustrates an isometric view of a Printed Circuit Board, hereinafter referred to as PCB for the inverter unit of FIG. 3.
Figure 12:
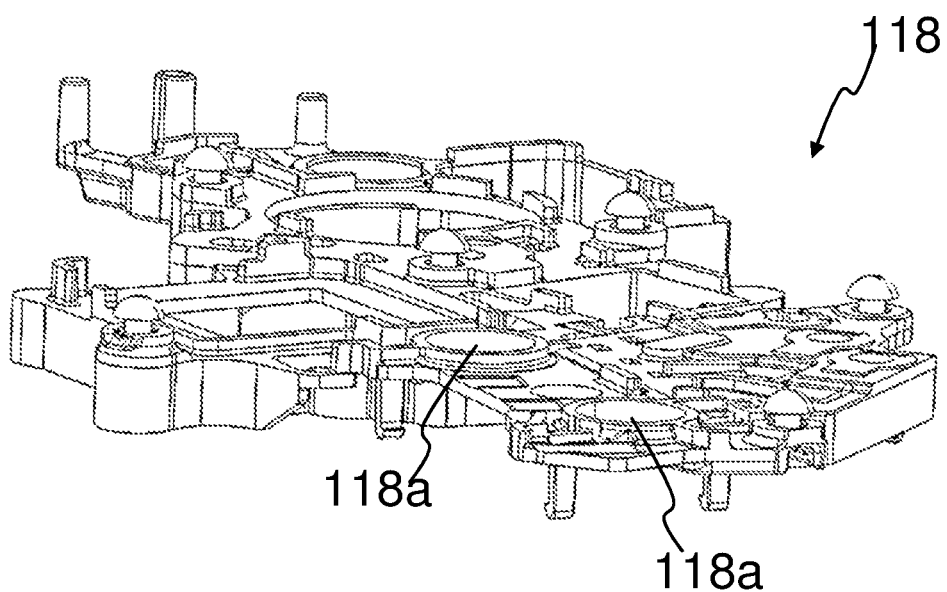
FIG. 12 illustrates an isometric view of a separator for the inverter unit of FIG. 3.

The inverter 110 further includes a separator 118 disposed between the power module 112 and the removable cover 120c. FIG. 3 illustrates the relative positions and the order of the insulating member 130 with respect to the PCB 116 and the separator 118 in which these elements are assembled with respect to each other. FIG. 11 illustrates an isometric view of the PCB 116 for the inverter 110. The PCB 116 also includes a plurality of electronic components 116a (not illustrated in the FIG. 11) mounted thereon. The separator 118 illustrated in FIG. 12 separates the electronic components 116a mounted on the PCB 116. FIG. 12 illustrates an isometric view of the separator 118 for the inverter 110. The separator 118 is of plastic material and provides insulation between the various electronic components 116a mounted on the PCB 116, thereby preventing short circuit due to electronic components accidentally coming into contact with each other or insufficient gap between the electronic components 116a. The separator 118 may further includes arrangement for positioning the PCB 116 inside the inverter housing 120. The PCB 116 and the separator 118 include corresponding first openings 116b and second openings 118a for passage of the insulating member 130 therethrough. The number and placement of the first openings 116b on the PCB 116 is corresponding to the number and spacing between the bolts 114, more specifically, to the number and spacing of the insulating members 130 corresponding to the bolts 114. Similarly, the number and placement of the second openings 118a on the separator 118 is corresponding to the number and spacing between the bolts 114, more specifically, to the number and spacing of the insulating members 130 corresponding to the bolts 114. The first openings 116b formed on the PCB 116 and the second openings 118a formed on the separator 118 are aligned with respect to each other to allow passage of the insulating members 130 through the first openings 116b and the second openings 118a respectively. The insulating members 130 after passing through the first openings 116b and the second openings 118a rests on the power module 112 and urges the power module 112 against the end wall 120a of the inverter housing 120 as threaded portions 114b of the bolts 114 passes through the corresponding holes 132a formed on the insulating members 130 and engages with the end wall 120a. The insulating member 130 in the form of the plastic cup further acts as a poka-yoke feature for facilitating the assembly of the power module 112, the separator 118 and the PCB 116 to the end wall 120a of the inverter housing 120.

Figure 13:
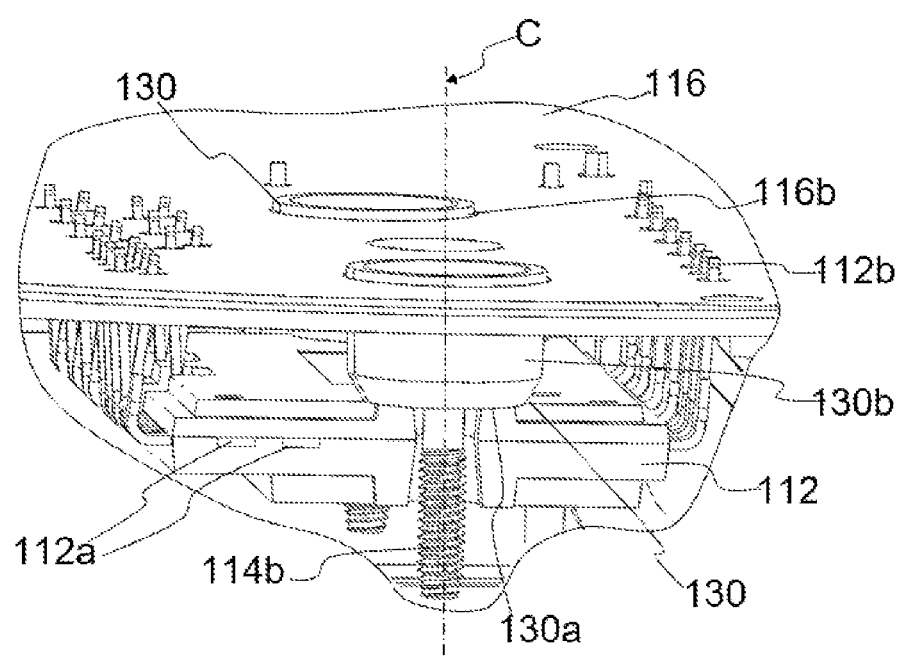
FIG. 13 depicts an enlarged view of the power module, the insulating member and the bolt assembly of FIG. 3 with the pins emanating from the power module engaging with the PCB.

FIG. 13 depicts an enlarged view of the assembly of the power module 112, the insulating member 130 and the bolt 114 along with the PCB 116. Further, FIG. 12 illustrates the connection between the power module 112 and the PCB 116 via the pins 112b emanating from the power module 112. Referring to the FIG. 13, sufficient clearance is provided between the threaded shaft portion 114b of the bolt 114 and the inside walls of the corresponding cutouts 112c formed on the casing 112d of the power module 112. Further, the extreme end of the lead frames are inserted in to the corresponding holes formed on the PCB 116. With such connection of the pins 112b and the PCB 116, secure positioning and mounting of the power module 112 with respect to the PCB 116 in spite of clearance between threaded shaft portion 114b of the bolt 114 and inside walls of the cut outs 112c formed on the power module 112 is achieved. Such configuration prevents the threaded shaft portion 114b of the bolt 114 from contacting the inside walls of the corresponding cutouts 112c of the power module 112, thereby avoiding a short cut of the creepage distance via the contacting portion. Further, such configuration allows movement of the power module 112 in axial direction of deployment of the bolts 114 to securely mount the power module 112 in desired position in axial direction with respect to the PCB 116. More specifically, such configuration prevents relative movement of the power module 112 with respect to the PCB 116 in lateral direction but allows relative movement along the axial direction of movement of the bolts 114 when the bolts are deployed to urge the power module 112 against the end wall 120a.

Figure 14:
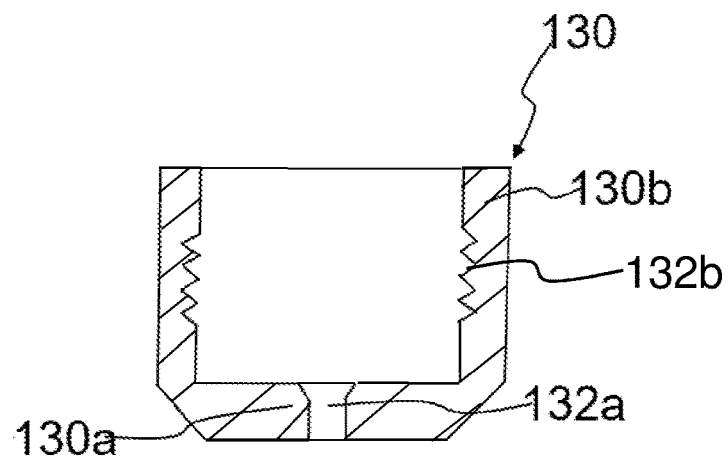
FIG. 14 illustrates a sectional view of the insulating member with side walls thereof having irregular inside surface.

In accordance with another embodiment illustrated in FIG. 14, at least one of inside and outside surface of the peripheral wall 130b is an irregular surface, particularly, is provided with serrations 132b to increase the creepage distance between the high voltage portions 112a of the power module 112 and the bolt head 114a. Although, in the FIG. 13, the serrations 132b are depicted on the inside surface of the peripheral wall 130b, however, the serrations 132b can be configured on the outside surface of the peripheral wall 130b.

However, the present invention is not limited to a particular shape, configuration, number, placement of the insulating members, the configuration of the peripheral wall 130b, the annular space between the side wall of and the bolt, height of the sidewall relative to the bolt head, position of the hole on the base portion through which the bolt passes.

Figure 15:
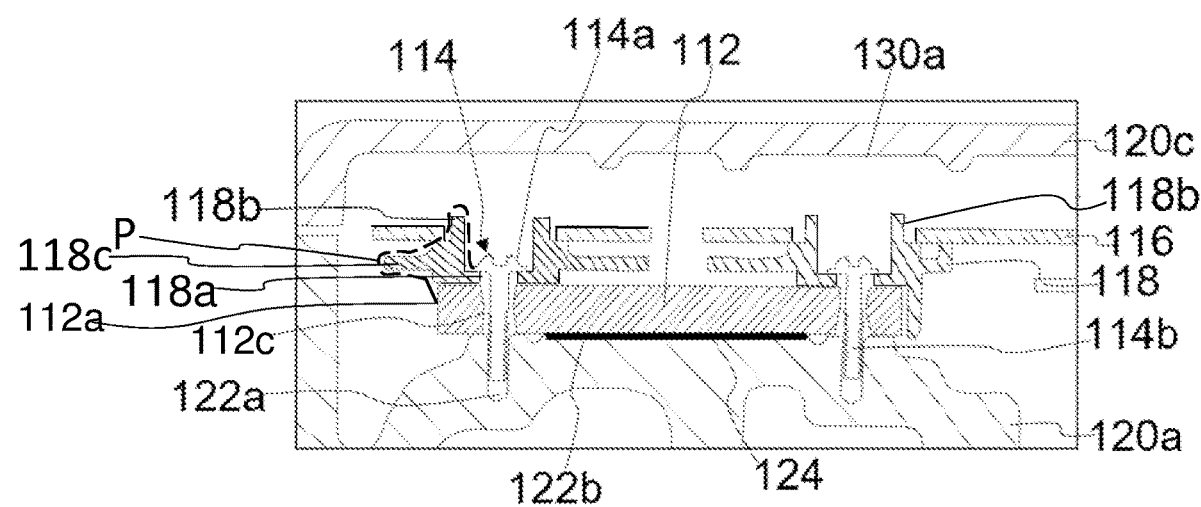
FIG. 15 illustrates cross sectional view of another embodiment of the inverter unit of FIG. 10, wherein the separator is integrally formed with the insulating member, also is depicted the creepage distance "P"

In accordance with yet another embodiment as illustrated in FIG. 15, the separator 118 includes the insulating member 118b integrally formed therewith. In such configuration, the insulating member 118b passes through the first openings 116b and the separator 118 rests on the power module 112 and urges the power module 112 against the end wall 120a of the inverter housing 120 as threaded portions 114b of the bolts 114 passes through the corresponding holes 118a formed on the insulating members 118 and engages with the end wall 120a. More specifically, the separator 118 includes a lip portion 118c extending parallel to the power module 112. With such configuration, the creepage distance between the high voltage portions 112a of the power module 112 and the bolt head 114a is further increased, as the current emanating from the high voltage portions 112a of the power module 112 have to follow a creepage path "P" along the surface of the separator 118 and the insulating member 118b integrally formed with the separator 118 to reach the bolt head 114a.

Also is disclosed a motor driven compressor 1000 in accordance with an embodiment of the present invention. Again referring to the FIG. 2, the motor driven compressor 1000 includes a compression unit 300, an electric motor 200 and an inverter unit 100. The compression unit 300 compresses fluid, particularly the refrigerant before the refrigerant is supplied to the condenser of the air conditioning loop. The electric motor 200 drives the compression unit 300. The inverter unit 100 as disclosed above drives the electric motor 200.

Obviously, numerous modifications and variations of the present invention are possible in light of the above teachings. It is therefore to be understood that the invention may be practiced otherwise than as specifically described herein.

In any case, the invention cannot and should not be limited to the embodiments specifically described in this document, as other embodiments might exist. The invention shall spread to any equivalent means and any technically operating combination of means.

We claim:

1. An inverter unit comprising:
    an inverter for driving an electric motor, the inverter comprising at least one power module for converting a High Voltage Direct Current to a three-phase Alternating Current that drives the electric motor;
    an inverter housing for receiving the inverter;
    wherein the power module is adapted to be mounted on an end wall of the inverter housing by bolts and an insulating member is disposed between a head portion of the bolt and the power module,
    wherein the insulating member comprises a base portion, the power module being securely mounted to the base portion and the end wall of the inverter housing by bolts,
    wherein a threaded shaft portion of the bolt axially passes through a hole formed on the base portion and cut outs provided on the power module and engages with the end wall while the head portion of the bolt remains above the base portion such that the base portion is disposed between and separates the head portion of the bolt and the power module,
    wherein the insulating member further comprises a peripheral wall axially extending from the base portion and away from the power module, and
    wherein the peripheral wall of the insulating member has a height at least two times a height of the head portion of the bolt.

2. The inverter unit as claimed in claim 1, wherein the end wall defines a closed end of the inverter housing formed with holes to configure threaded engagement with the corresponding bolts.

3. The inverter unit as claimed in claim 1, wherein the base portion of the insulating member is having a radial dimension greater than the radial dimension of the head portion of the bolt to define annular space there-between.

4. The inverter unit as claimed in claim 1, wherein the hole is centrally disposed with respect to the base portion.

5. The inverter unit as claimed in claim 1, wherein the peripheral wall is of uniform height along a periphery of the base portion.

6. The inverter unit as claimed in claim 1, wherein at least a portion of the peripheral wall of the insulating member is inclined with respect to a central axis "C".

7. The inverter unit as claimed in claim 1, wherein at least one of inside and outside surface of the peripheral wall is an irregular surface.

8. The inverter unit as claimed in claim 1, wherein the insulating member is of hollow configuration with a circular cross section.

9. The inverter unit as claimed in claim 1, wherein at least one of the insulating members is over-molded with the corresponding bolt and integrally formed therewith.

10. The inverter unit as claimed in claim 1, wherein the inverter unit further comprises a Printed Circuit Board (PCB) and a separator disposed between the power module and a removable cover.

11. The inverter unit as claimed in claim 10, wherein the Printed Circuit Board (PCB) and the separator comprises corresponding first openings and the second openings respectively for passage of the insulating member therethrough.

12. The inverter unit as claimed in claim 10, wherein the separator comprises the insulating member integrally formed therewith.

13. The inverter unit as claimed in claim 1, wherein the bolt is adapted to be deployed using a deploying tool selected from a group comprising of screwdriver, alley key.

14. A motor driven compressor comprising:
    a compression unit adapted to compress fluid;
    an electric motor driving the compression unit; and
    an inverter unit as claimed in claim 1 adapted to drive the electric motor.

* * * * *